(12) United States Patent
Kang et al.

(10) Patent No.: US 7,642,563 B2
(45) Date of Patent: Jan. 5, 2010

(54) LED PACKAGE WITH METAL PCB

(75) Inventors: Suk Jin Kang, Ansan-si (KR); Do Hyung Kim, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 0 days.

(21) Appl. No.: 12/058,417

(22) Filed: Mar. 28, 2008

(65) Prior Publication Data

US 2008/0237624 A1    Oct. 2, 2008

(30) Foreign Application Priority Data

Mar. 30, 2007   (KR) .................. 10-2007-0032018

(51) Int. Cl.
*H01L 33/00* (2006.01)
(52) U.S. Cl. .................. 257/99; 257/E33.066; 438/27
(58) Field of Classification Search .................. 257/79, 257/98, 99, 100, 787
See application file for complete search history.

(56) References Cited

U.S. PATENT DOCUMENTS

2004/0079957 A1*   4/2004   Andrews et al. ............ 257/100
2004/0099874 A1*   5/2004   Chang et al. .................. 257/98

FOREIGN PATENT DOCUMENTS

| KR | 10-2004-0092512 | 11/2004 |
| KR | 10-2007-0001349 | 1/2007 |

* cited by examiner

*Primary Examiner*—Anh T Mai
*Assistant Examiner*—Whitney Moore
(74) *Attorney, Agent, or Firm*—H.C. Park & Associates, PLC

(57) ABSTRACT

The present invention relates to a light emitting diode (LED) package. An object of the present invention is to provide an LED package having a metal PCB, which has a superior heat dissipation property and a compact structure, does not largely restrict use of conventional equipments, and is compatible with an electronic device or illumination device currently used widely. To this end, an LED package according to the present invention comprises a metal printed circuit board (PCB) formed by laminating first and second sheet metal plates with an electric insulating layer interposed therebetween; and an LED chip mounted on the first sheet metal plate of the metal PCB, wherein the first sheet metal plate has electrode patterns and leads respectively extending from the electrode patterns.

18 Claims, 2 Drawing Sheets

LED PACKAGE WITH METAL PCB

RELATED APPLICATIONS

This application claims priority to Korean Patent Application No. 10-2007-0032018, filed Mar. 30, 2007, the contents of which are incorporated herein by reference in their entirety.

FIELD OF THE INVENTION

The present invention relates to a light emitting diode (LED) package, and more particularly, to an LED package with a metal PCB.

BACKGROUND OF THE INVENTION

In general, an LED is an element in which electrons and holes are combined in a P-N semiconductor junction structure by application of current thereby emitting certain light. The LED is typically formed to have a package structure, in which an LED chip is mounted, and is frequently referred to as an "LED package." Such an LED package is generally mounted on a printed circuit board (PCB) and receives current applied from electrodes formed on the PCB to thereby emit light.

In an LED package, heat generated from an LED chip has a direct influence on the light emitting performance and life span of the LED package. The reason is that when heat generated from the LED chip remains for a long period of time, dislocation and mismatch occur in a crystal structure of the LED chip. Moreover, a high power LED package has been recently developed. Since the high power LED package is operated by high-voltage power and a large amount of heat is generated in an LED chip due to the high voltage, a separate device for effectively dissipating the generated heat is required.

Therefore, there has been developed a conventional LED package for enhancing heat dissipation performance using a metal printed circuit board (metal PCB) in which an insulating layer and a metal pattern layer are sequentially formed on an aluminum base. For example, such a conventional LED package is fabricated in such a manner that a hole cup is formed in the aluminum base so that a portion of the aluminum base is exposed upward by a groove machining process such as cutting, an LED chip adheres to the hole cup, and then the LED chip and the metal pattern layer are connected to each other through a conductive wire.

However, the conventional LED package is difficult to be fabricated into a compact structure due to a large thickness of the aluminum base, and does not have a lead structure for electrically connecting the LED chip to external electrodes. For this reason, it may be difficult to mount the conventional LED package on a typically used PCB. This means that the conventional LED package is less compatible with a conventional electronic device or illumination device. Since current LED package manufacturers mostly have equipments suitable for fabricating LED packages with a lead structure, the conventional LED package limits the use of the existent equipments as described above. For this reason, the conventional LED package is also uneconomical.

Additionally, in the conventional LED package, since the hole cup is formed by a groove machining process such as a cutting process, the mounting surface of an LED chip is uneven due to the groove machining process, which causes a die attaching process of an LED chip to be difficult. In addition, the die-attached LED chip may be easily damaged due to thermal and mechanical impact.

An object of the present invention is to provide an LED package having a metal PCB, which has a superior heat dissipation property and a compact structure, does not largely restrict use of conventional equipments, and is compatible with an electronic device or illumination device currently used widely.

An LED package according to an aspect of the present invention comprises a metal printed circuit board (PCB) formed by laminating first and second sheet metal plates with an electric insulating layer interposed therebetween; and an LED chip mounted on the first sheet metal plate of the metal PCB, wherein the first sheet metal plate has electrode patterns and leads respectively extending from the electrode patterns.

At this time, each of the leads is preferably formed by bending a portion of the first sheet metal plate extending in an outer side direction from the metal PCB. More preferably, each of the leads has an enlarged contact area with an external electrode through two-step bending of the portion of the first sheet metal plate. Accordingly, each lead can have an enlarged contact area with an external electrode.

Alternatively, each of the leads may comprises a terminal pattern formed by patterning the second sheet metal plate in correspondence to the electrode pattern; and a via conductive portion passing through the metal PCB to connect the electrode pattern and the terminal pattern.

According to preferred embodiments of the present invention, the first and second sheet metal plates may be made of copper or copper alloy. The LED package may further comprise a molding member formed on the first sheet metal plate to cover the LED chip. The LED package may further comprise a hole cup formed around the LED chip to adjust a directional angle of light emitted from the LED chip. The hole cup may be formed of resin, metal, ceramic or a composite thereof. The hole cup may be made of an FR4 material. Further, the hole cup may include an insulating plate and a metal reflective plate, each of which has an opening, and which are sequentially formed on the first sheet metal plate. In addition, the metal reflective plate may be made of aluminum.

DETAILED DESCRIPTION OF THE INVENTION

Hereinafter, preferred embodiments of the present invention will be described in detail with reference to the accompanying drawings.

Figure 1:
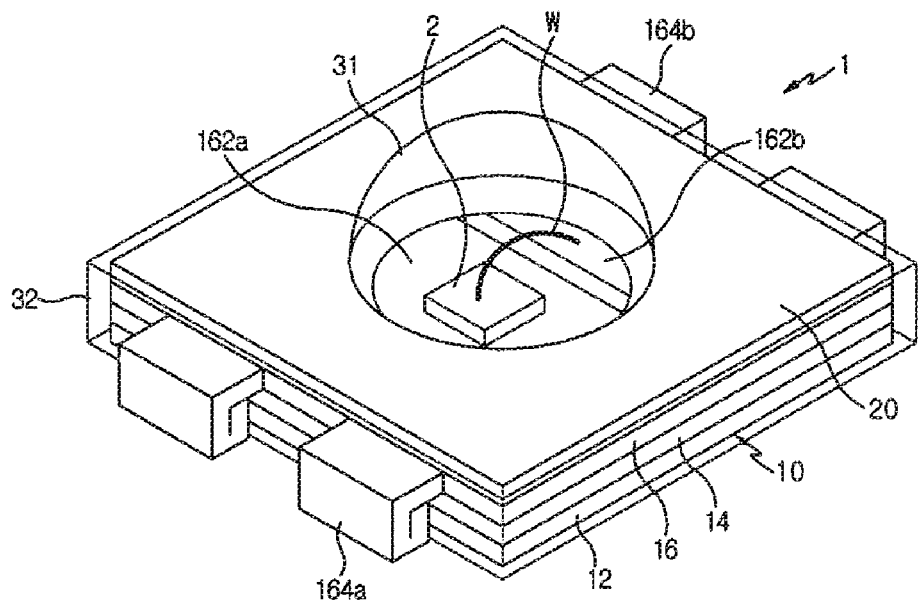
FIG. 1 is a perspective view showing an LED package according to an embodiment of the present invention.
Figure 2:
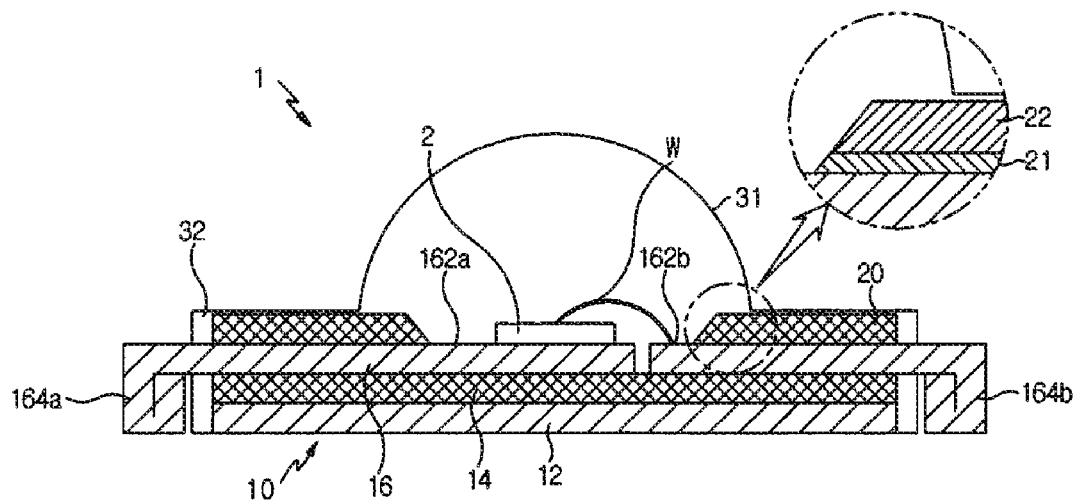
FIG. 2 is a sectional view of the LED package shown in FIG. 1.

FIG. 1 is a perspective view showing an LED package according to an embodiment of the present invention, and FIG. 2 is a sectional view of the LED package shown in FIG. 1.

As shown in FIGS. 1 and 2, the LED package 1 of this embodiment comprises a metal PCB 10, an LED chip 2 mounted on the metal PCB 10, and the like. A transparent molding member 31 for protecting the LED chip 2 is formed on the metal PCB 10 in a generally hemispherical shape. The molding member 31 further includes an extension portion 32 extending integrally with the molding member 31 to cover portions of top and side surfaces of the metal PCB 10, and the extension portion 32 can protect not only the LED chip 2 but also the metal PCB 10 from the outside.

The metal PCB 10 of this embodiment comprises first and second sheet metal plates 16 and 12 and an insulating layer 14 interposed between the sheet metal plates 16 and 12, wherein the first and second sheet metal plates 16 and 12 are laminated with the insulating layer 14 interposed therebetween. The second sheet metal plate 12 is made of copper or copper alloy to form a base of the metal PCB 10, and the first sheet metal plate 16 is made of copper or copper alloy to be electrically insulated from the second sheet metal plate 12 by the insulating layer 14.

The first sheet metal plate 16 comprises a first electrode pattern 162a, to which the LED chip 2 adheres, and a second electrode pattern 162b patterned to be spaced apart from the first electrode pattern 162a. The LED chip 2 on the first electrode pattern 162a is electrically connected to the second electrode pattern 162b by a bonding wire W. At this time, the insulating layer 14 has an electrically insulating property. For the purpose of smooth dissipation of heat generated from the LED chip 2, the insulating layer 14 is preferably formed of a material with excellent thermal conductivity.

According to the embodiment of the present invention, the first sheet metal plate 16 further includes leads 164a and 164b extending in an outer side direction of the metal PCB 10. The leads 164a and 164b are portions connected to external electrodes on an external PCB (not shown) on which the LED package 1 is mounted. Through two-step bending, each of the leads 164a and 164b is directed downward and has a broad contact area with an external electrode (not shown). That is, each of the leads 164a and 164b is bent to be directed downward through a first bending process and to fold up through a second bending process, thereby having an end with a thickness greater than the original thickness of the first sheet metal plate 16.

The LED package 1 shown in FIGS. 1 and 2 is of a top view type in which a package mounting surface and a light emitting surface are positioned to be opposite to each other due to the bending positions and directions of the leads 164a and 164b. However, it may be considered that the bending positions and directions of the leads 164a and 164b are different from each other whereby the package mounting surface and the light emitting surface are perpendicular to each other. As such, the configuration in which the package mounting surface and the light emitting surface are perpendicular to each other is suitable for implementing an LED package typically called a side view type LED package.

In addition, the LED package 1 of this embodiment further includes a hole cup 20 for obtaining a desired directional angle of light, i.e., for adjusting the directional angle of light emitted from the LED chip 2. The hole cup 20 includes an opening, in which a portion of the molding member 31 is filled, and serves to reflect light within a desired directional angle range by surrounding a circumference of the LED chip 2 on the first sheet metal plate 16. Since the hole cup 20 is directly laminated on the first sheet metal plate 16 of the metal PCB 10, it is unnecessary to form the hole cup 20 by machining a groove in the metal PCB 10. Accordingly, the chip mounting surface of the metal PCB 10 is formed to be flat unlike the prior art.

According to the embodiment of the present invention, the hole cup 20 may be used by forming an opening in a plate-shaped member and formed of a resin, metal, ceramic or a composite thereof. As an example, the hole cup 20 may be formed of a material such as FR4. The FR4 is Epoxy Resin Bonded Glass Fiber (ERBGF) reinforced by combining glass fiber with epoxy, which has excellent strength and light reflexibility, and is generally used as a raw material of PCBs.

As another example, the hole cup 20 may be formed in such manner that an insulating plate 21 and a metal reflective plate 22, which are respectively formed with openings, adhere to each other as shown in the enlarged view of FIG. 2. At this time, the insulating plate 21 serves to cause the metal reflective plate 22 and the first sheet metal plate 16 positioned under the insulating plate 21 to be electrically insulated. Preferably, the metal reflective plate 22 is made of an aluminum material.

Figure 3:
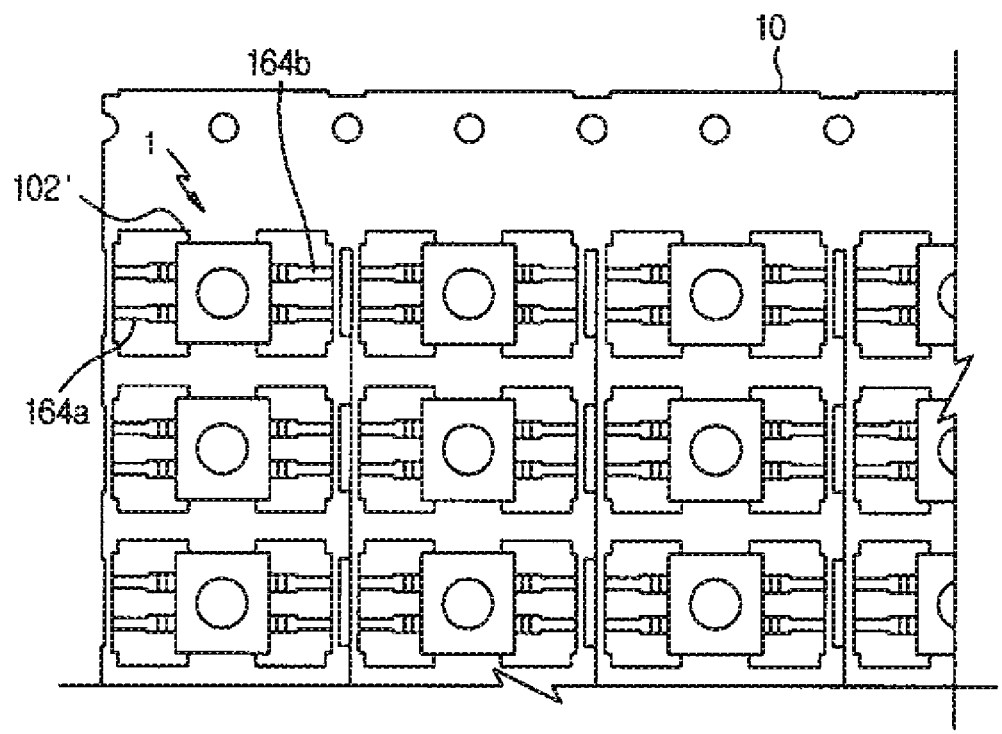
FIG. 3 is a view illustrating an example of manufacturing a plurality of LED packages having one large metal PCB as a base.

According to the embodiment of the present invention, the aforementioned metal PCB 10 is a unit metal PCB cut and separated from a large metal PCB 10' (hereinafter, referred to as a "laminated raw material") shown in FIG. 3, and a plurality of the LED packages 1, each of which has the metal PCB 10, are previously formed using the laminated raw material 10' as a base, as shown in FIG. 3. The laminated raw material 10' is a laminate of the first sheet metal plate 16, the insulating layer 14 and the second sheet metal plate 12, which are patterned and machined to have a predetermined shape. The plurality of LED packages 1 are supported on the laminated raw material 10' through the leads 164a and 164b extending from the first sheet metal plate 16 and supporting portions 102' of the respective layers. The supporting portions 102' and the leads 164a and 164b are cut, and the leads 164a and 164b are bent as described above, thereby completing the unit LED packages 1 each having the configuration shown in FIGS. 1 and 2.

Figure 4:
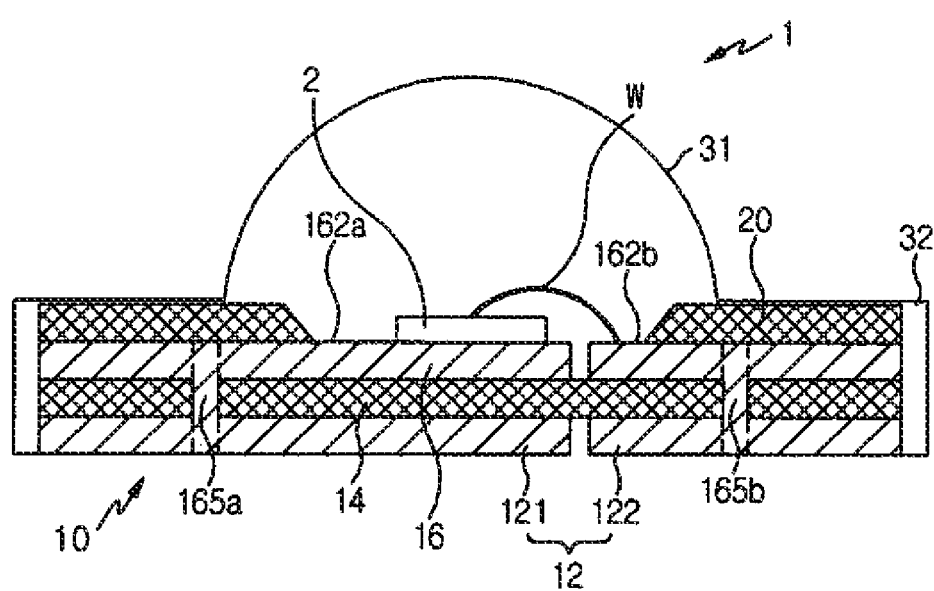
FIG. 4 is a sectional view of an LED package according to another embodiment of the present invention.

FIG. 4 is a sectional view of an LED package 1 according to another embodiment of the present invention. The LED package 1 of this embodiment has a configuration substantially equal to the aforementioned embodiment, except the configuration of leads extending from the electrode patterns 162a and 162b of the first sheet metal plate 16. Hereinafter, the configuration of the leads different from those of the previous embodiment will be mainly described.

As shown in FIG. 4, the leads of this embodiment include terminal patterns 121 and 122 formed by patterning a second sheet metal plate 12 in correspondence to electrode patterns 162a and 162b of a first sheet metal plate 16, and via conductive portions 165a and 165b passing through a metal PCB 10 to connect the electrode patterns 162a and 162b and the terminal patterns 121 and 122. At this time, the via conductive portions 165a and 165b may be formed by previously forming openings bored through the metal PCB 10 and then filling the openings with a metal made of the same material as the first sheet metal plate 16 and/or the second sheet metal plate 12, for example, by a plating method or the like.

As described above, an LED package according to the present invention has a sufficient heat dissipation property and a compact structure, and includes leads connected to external electrodes while using a metal PCB and having a structure approximately equal to a general LED package, thereby having excellent compatibility with a conventional electronic device or illumination device. Further, the LED package according to the present invention and a general LED package without a metal PCB are manufactured through a considerably similar process. Thus, there is an economical advantage in that many equipments possessed by current LED package manufacturers can be used in manufacturing the LED package according to the present invention as they are. Furthermore, an additional groove machining process is not required to form a hole cup in which an LED chip is positioned, so that LED package according to the present invention has a flat chip mounting surface. Accordingly, a die attaching process of the LED chip can be performed more easily as compared with a conventional metal PCB-type LED package, and the die attached LED chip is strong against thermal and mechanical impact.

Although the present invention have been described with a specified embodiment, it will be apparent to those skilled in the art that various modifications, changes and variations can be made thereto within the scope of the present invention and the appended claims. Therefore, the aforementioned descriptions and the accompanying drawings should be construed as not limiting the technical spirit of the present invention but illustrating the present invention.

The invention claimed is:

1. A light emitting diode (LED) package, comprising:
a metal printed circuit board (PCB) comprising a first sheet metal plate and a second sheet metal plate with an electric insulating layer interposed therebetween; and
an LED chip mounted on the first sheet metal plate of the metal PCB,
wherein the first sheet metal plate has electrode patterns and leads respectively extending from the electrode patterns.

2. The LED package of claim 1, wherein each of the leads comprises a portion of the first sheet metal plate extending in an outer side direction from the metal PCB.

3. The LED package of claim 2, wherein each of the leads has an enlarged contact area with an external electrode through two-step bending of the portion of the first sheet metal plate.

4. The LED package of claim 2, wherein the extending portion of the first sheet metal plate comprises an end with a thickness greater than the thickness of other portions of the first sheet metal plate.

5. The LED package claim 1, wherein each lead further comprises:
a terminal pattern comprising the second sheet metal plate; and
a via conductive portion passing through the metal PCB, the via conductive portion connecting the electrode pattern and the terminal pattern.

6. The LED package of any one of claims 1 to 5, wherein the first sheet metal plate and the second sheet metal plates each comprise copper or copper alloy.

7. The LED package of claim 1, further comprising a molding member formed on the first sheet metal plate to cover the LED chip.

8. The LED package of claim 7, further comprising a hole cup formed around the LED chip to adjust a directional angle of light emitted from the LED chip.

9. The LED package of claim 8, wherein the hole cup comprises resin, metal, ceramic, or a composite thereof.

10. The LED package of claim 8, wherein the hole cup comprises an FR4 material.

11. The LED package of claim 8, wherein the hole cup comprises an insulating plate and a metal reflective plate, each of which has an opening, and which are sequentially formed on the first sheet metal plate.

12. The LED package of claim 11, wherein the metal reflective plate comprises aluminum.

13. The LED package of claim 8, wherein the hole cup contacts a surface of the first sheet metal plate.

14. The LED package of claim 7, wherein the molding member further comprises an extension portion that covers a top surface and a side surface of the metal PCB.

15. The LED package of claim 14, wherein the extension portion is integrally formed with the molding member.

16. The LED package of claim 1, wherein the electrode patterns and leads are integrally formed.

17. The LED package of claim 1, wherein the first sheet metal plate and the second sheet metal plate each contact a surface of the electric insulating layer.

18. The LED package of claim 17, wherein an insulating plate is disposed directly on the first sheet metal plate and a metal reflective plate is disposed directly on the insulating plate.

* * * * *